March 17, 1959 L. D. ARMSTRONG ET AL 2,878,432
SILICON JUNCTION DEVICES
Filed Oct. 12, 1956
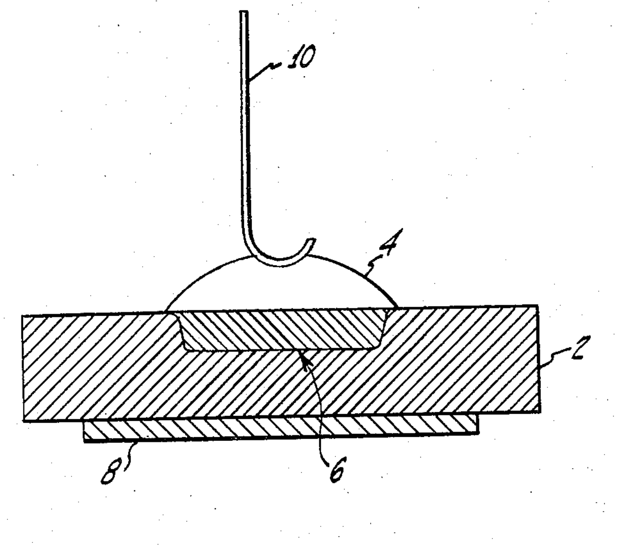
INVENTORS
LORNE D. ARMSTRONG,
HENRY D. HARMON &
HERBERT R. MEISEL
BY J. C. Whittaker
ATTORNEY United States Patent Office 2,878,432

Patented Mar. 17, 1959

2,878,432

SILICON JUNCTION DEVICES

Lorne D. Armstrong, Somerville, Henry D. Harmon, Montclair, and Herbert R. Meisel, South Orange, N. J., assignors to Radio Corporation of America, a corporation of Delaware Application October 12, 1956, Serial No. 615,681

6 Claims. (Cl. 317—240)

This invention relates to improved rectifying junction-type semiconductor devices especially of the type employing a body of silicon. More particularly the invention relates to an improved silicon diode rectifying device wherein a P–N junction is formed in a silicon body by an aluminum electrode.

Semiconductor-rectifying devices of the junction-type are well known. Signal rectification is provided by the junction or barrier established between adjacent regions of different conductivity (i. e., P-type and N-type regions). Several forms of this device are known; generally the particular structures or arrangements possible are determined by the method of manufacture. The instant invention relates to improved junction-type devices formed by alloying an electrode capable of producing one type of conductivity to a semiconductor body of the opposite type of conductivity. In this process a semiconductor body of N-type conductivity for example, is provided. The conductivity type of this body may be established by introducing an N-type impurity into the melt from which a crystal is drawn which crystal is later cut up to provide the semiconductor bodies for devices of the type described. A pellet capable of establishing P-type conductivity in the semiconductor body is positioned on a surface of the body and the assembly is heated to cause at least some of the P-type impurity pellet and some of the material of the body in contact therewith to melt and dissolve in each other. Upon cooling, the molten material recrystallizes to form a region of P-type conductivity in the body. Between the N-type body itself and this P-type region a P–N rectifying junction is established. The device is completed by ohmically connecting leads to the N-type and P-type regions of the body. Of course more than one such rectifying junction can be established in the semiconductor body as by alloying in a P-type impurity electrode on the opposite surface of the body. Such a device thus comprises adjacent regions arranged in P–N–P order, for example, and is termed a "transistor."

Rectifying junction-type devices of this type may employ germanium or silicon semiconductor bodies. The use of silicon for this purpose is desirable because silicon devices can be satisfactorily operated at significantly higher temperatures than germanium devices. The temperature limitations imposed on all semiconductor devices is determined primarily by the energy gap between the valence band and the conduction band of the semicondution band of the semiconductor material. When the temperature of the device reaches a point where the thermal energy is sufficient to raise substantial numbers of electrons across the energy gap, the semiconductive characteristics of the material are adversely affected. For example, the energy gap of germanium is about 0.7 electron volt and many devices using germanium become inoperative at temperatures as low as 80° C. On the other hand, the energy gap of silicon is about 1.1 electron volts and devices made thereof are operative at temperatures as high as 150° C.

Silicon is not easily alloyed to other materials such as conductivity-type-determining impurities. Part of the explanation of this lies in the relatively high melting point of silicon (1420° C.) and the high temperatures only at which silicon will form an eutectic with other materials. Another factor involved in alloying other materials to silicon is that silicon has poor wetting properties for many materials. One of the best conductivity-type-determining electrode materials for forming alloy junctions in silicon is aluminum. Aluminum readily alloys with silicon to form excellent rectifying junctions at temperatures between about 700–850° C. Hence aluminum is a preferred P-type electrode material for silicon semiconductor devices.

After the aluminum "dot" or electrode is fused to the silicon body by the alloying process, a good electrical connection or lead must be ruggedly made to the aluminum electrode. As is well known, aluminum itself is not easily soldered or fused by alloying to most metals. Electrical connections to aluminum using copper or nickel wires for example are mechanically weak and electrically poor (non-ohmic). Furthermore, where the electrical connections to the aluminum electrode are to be made either during or after the alloying operation, it is greatly desirable that the electrical connection to the aluminum dot be obtained without the necessity of employing soldering or alloying temperatures greatly in excess of the temperature at which aluminum and silicon alloy, otherwise, this operation might upset the precise establishment of the P–N junction region or impair the junction altogether or otherwise result in a complete loss of control of the process. Finally the electrical connection or wire should be of a material which will be unaffected by subsequent chemical treatment of the assembled device such as etching with nitric and hydrofluoric acids.

It is therefore an object of this invention to provide an improved mechanical and electrical connection to an aluminum electrode for use on a silicon semiconductor body.

A further object of the invention is to provide an improved electrical connection to an aluminum electrode for a silicon semiconductor body which connection is mechanically rugged, electrically good, and unaffected by chemical treatments such as etching.

Another object of the invention is to provide an improved mechanical and electrical connection to an aluminum electrode by an alloying process at a temperature not greater than the alloying temperature of aluminum and silicon.

Another object of the invention is to provide an improved silicon semiconductor device of the alloy junction type.

Yet another object of the invention is to provide a silicon semiconductor device having an aluminum electrode body alloyed thereto with an improved mechanical and electrical connection to the aluminum electrode.

Another object of the invention is to provide an improved method for manufacturing silicon semiconductor devices of the alloy junction type.

These and other objects and advantages of the invention are achieved by employing a tungsten wire or ribbon as the electrical connection or lead alloyed to the aluminum electrode of a silicon junction-type rectifying device. The tungsten alloys with the aluminum electrode to form an excellent mechanical and electrical connection thereto at a temperature no greater than the temperature at which aluminum alloys with silicon. In addition, tungsten is relatively chemically inert, especially to etchants such as mixtures of nitric and hydrofluoric acids employed on silicon devices.

The invention and several embodiments thereof will be described in greater detail by reference to the drawing in which the sole figure is a cross-sectional elevational view of a silicon junction-type rectifying device or diode.

The rectifying device in accordance with the invention is made by placing an N-type silicon pellet 2 in a suitable jig which also permits accurately locating and maintaining an aluminum "dot" 4 on at least one surface of the pellet. Illustratively, the silicon pellet may be 0.010 inch thick and about 0.002 square inch in area. Thereafter a tungsten wire 10 about .005 or .010 inch in diameter, bent in the shape of a U is jigged into a position whereby the curved portion of the U contacts the aluminum dot. Alternatively, a piece of tungsten ribbon, about .020" x .002" in a cross-section may be employed. The ribbon may be either U or S shaped; in either case the curved portion of the ribbon is contacted to the aluminum dot.

This jigged assembly is then placed in an oven or furnace and heated to a temperature between about 700° to 850° C. At this temperature two actions occur approximately simultaneously: the aluminum dot alloys with the silicon pellet and also with the tungsten just enough to form a good mechanical and electrical connection. Thus in one operation an alloy-junction 6 is formed and a mechanically strong electrical connection is made to the aluminum "dot" electrode. This dual alloying operation thus occurring is a feature of the instant invention and offers a distinct advantage over a two-step firing program (alloying the Al electrode to the silicon pellet and then subsequently alloying the tungsten wire to the Al electrode). The two-step program entails the risk that heating the device a second time to the same temperature at which silicon and aluminum alloy in order to attach the tungsten wire to the aluminum may result in degrading the junction already formed or producing excessive penetration into the silicon pellet by the aluminum. Thus the two-step firing program requires a greater degree of caution and control to produce satisfactory silicon rectifying devices. The combination of an aluminum electrode, silicon pellet, and tungsten connector thus is most fortuitous. It is to be noted that in manufacturing other semiconductor devices where three different materials are employed for the semiconductor body, junction-forming electrode, and electrical connector, a two-step firing program is most always required because of the significantly different temperatures at which the materials alloy with each other.

In addition to alloying with aluminum to form a strong mechanical and electrical connection at the same temperature at which aluminum alloys with silicon, tungsten is also a good electrical conductor, has an extremely high melting point well beyond the temperatures at which the device is operated, and is relatively inert chemically. Thus it satisfies all of the rather stringent requirements for semiconductor parts and materials. Tungsten also alloys with aluminum without requiring fluxes and the like which might possibly contribute to contamination of the device or require additional processing steps for the removal of excess flux. In using tungsten as described herein, it is only necessary that it be clean prior to alloying and this is easily and satisfactorily accomplished by immersing the tungsten in a mixture of nitric and hydrofluoric acids.

Since aluminum is a P-type impurity in silicon, the silicon must be of N-type conductivity to permit the establishment of a P–N rectifying junction. Suitable N-type impurities with which the silicon may be doped are arsenic, antimony and phosphorus.

The next step in the fabrication of the device is to provide an ohmic (non-rectifying) base connection to the silicon pellet 2. It has been found that the best ohmic contact to N-type silicon is achieved by means of an alloy of gold with slight amounts of either antimony or arsenic. The best alloy composition for this purpose appears to be: 99 parts of gold by weight to 1 part of antimony or arsenic by weight. It has also been found desirable to apply the alloy to the silicon pellet as a powder and then oversolder the powder with a soft metal such as lead-tin eutectic to form a relatively large area contact 8 to the silicon pellet. Without this technique mechanical strains are set up when the base contact 8 is in turn soldered to a solid mount or stem, for example.

The final step prior to mounting the device in a hermetically-sealed container or can is to etch the assembled device comprising the silicon pellet with the junction-forming aluminum electrode, tungsten lead wire, and base contact in order to properly condition the surfaces of the device as, for example, to remove or render ineffective any undesirable impurities thereon. Alternatively the device may be etched prior to mounting the base electrode thereto.

The etch employed for silicon semiconductor devices comprises a mixture of from 1–3 parts by volume of 50% hydrofluoric acid to 20 parts of concentrated nitric acid. Optimum results are obtained with a ratio of 1 part by volume hydrofluoric acid to 10 parts by volume nitric acid. The device is immersed in the etch for from 15 seconds to 2 minutes.

Upon completion of the etching process, the device is rinsed in distilled water and dried. It may then be encapsulated in a thermosetting plastic for example, whose purpose is to protect the device from further possible future contamination and from moisture. Such encapsulating techniques are well known in the art and will not be further described here. The device may be first mounted in a can and then encapsulated by filling the can with the plastic or it may be dipped into the plastic and then mounted in a can or container.

The can or container may be of some suitable metal such as copper. Alternatively, a ceramic or vitreous material may be employed to enclose the device. In general, if a metallic container is used then at least one of the leads to the base and the junction electrodes which penetrated the can should be insulated therefrom as by a glass bead-filled hole, for example. In practice, the device is mounted as by soldering, for example, to a stem or header (not shown) which may then be inserted into a can which is filled with encapsulating material. The can is hermetically sealed to the header as by cold solder techniques. Alternatively, the header may be provided with an outwardly extending mounting surface and the can with an outwardly turned flange and the two sealed by welding.

There thus has been an improved silicon junction semiconductor device having a mechanically strong alloyed electrical connection to a junction electrode. Furthermore, this electrical connection to the junction electrode may be achieved simultaneously with the step of alloying the electrode to the silicon semiconductor body thus simplifying and enhancing the production of such devices.

What is claimed is:

1. A semiconductor device comprising a body of N-type semiconducting silicon having adjacent regions of P-type and N-type conductivity disposed therein forming a P–N rectifying junction therebetween, said P-type region being established by a body of aluminum alloyed to said silicon body, and an electrical connector comprising tungsten alloyed to said aluminum body.

2. A semiconductor device comprising a body of N-type silicon having an aluminum body alloyed thereto, and an electrical connector comprising tungsten alloyed to said aluminum body.

3. The method of manufacturing a semiconductor device having a body of N-type silicon comprising the steps of: Providing an assembly comprising an aluminum body in contact with said silicon body, a tungsten wire in contact with said aluminum body, and heating said assembly to the temperature at which at least a portion of said aluminum body is alloyed to said silicon body and said tungsten wire is simultaneously alloyed to said aluminum body.

4. The method of manufacturing a semiconductor device having a body of N-type silicon comprising the steps of: contacting an aluminum body to said silicon body and a tungsten wire to said aluminum body, heating said bodies to the temperature at which at least a portion of said aluminum body is alloyed to said silicon body and said tungsten wire is alloyed to said aluminum body in one operation, and thereafter making a non-rectifying connection to said silicon body.

5. The method according to claim 4 whrein said non-rectifying connection to said silicon body is made by applying to said silicon body a powdered alloy consisting predominantly of gold with slight amounts of an element selected from the group consisting of arsenic and antimony, and oversoldering said powdered alloy with a relatively soft metal.

6. The method according to claim 5 wherein said soft metal is tin-lead eutectic.

References Cited in the file of this patent

UNITED STATES PATENTS

| | | |
|---|---|---|
| 2,736,847 | Barnes | Feb. 28, 1956 |
| 2,752,541 | Losco | June 26, 1956 |
| 2,757,324 | Pearson | July 31, 1956 |
| 2,763,822 | Frola et al. | Sept. 18, 1956 |